United States Patent
Mizutani

(10) Patent No.: US 9,588,428 B2
(45) Date of Patent: Mar. 7, 2017

(54) RESIST REMOVING LIQUID, RESIST REMOVAL METHOD USING SAME AND METHOD FOR PRODUCING PHOTOMASK

(71) Applicant: FUJIFILM Corporation, Minato-ku, Tokyo (JP)

(72) Inventor: Atsushi Mizutani, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/883,730

(22) Filed: Oct. 15, 2015

(65) Prior Publication Data

US 2016/0033856 A1 Feb. 4, 2016

Related U.S. Application Data

(63) Continuation of application No. PCT/JP2014/059962, filed on Apr. 4, 2014.

(30) Foreign Application Priority Data

Apr. 17, 2013 (JP) .................................. 2013-086743

(51) Int. Cl.
| | | |
|---|---|---|
| *G03F 7/30* | (2006.01) | |
| *G03F 7/32* | (2006.01) | |
| *C11D 1/38* | (2006.01) | |
| *C11D 1/40* | (2006.01) | |
| *G03F 7/42* | (2006.01) | |
| *B08B 3/08* | (2006.01) | |

(Continued)

(52) U.S. Cl.
CPC ................. *G03F 7/322* (2013.01); *B08B 3/08* (2013.01); *C11D 1/38* (2013.01); *C11D 1/40* (2013.01); *C11D 7/3281* (2013.01); *C11D 11/0047* (2013.01); *G03F 1/22* (2013.01); *G03F 7/30* (2013.01); *G03F 7/425* (2013.01)

(58) Field of Classification Search
CPC ... G03F 7/20; G03F 7/32; G03F 7/322; C11D 11/0047; C11D 1/38; C11D 1/40; C11D 1/42; C11D 1/62; C11D 1/58
USPC ............... 430/322, 325, 329, 330, 331, 432; 510/175, 176
See application file for complete search history.

(56) References Cited

U.S. PATENT DOCUMENTS 7,700,259 B2 * 4/2010 Ogata ..................... C07C 69/54
430/270.1
2005/0250660 A1 11/2005 Takashima
(Continued)

FOREIGN PATENT DOCUMENTS

| | | |
|---|---|---|
| JP | 2005-066781 A | 3/2005 |
| JP | 2005-308858 A | 11/2005 |

(Continued)

OTHER PUBLICATIONS

Machine translation of JP 2012-033774 (no date).*
(Continued)

*Primary Examiner* — Amanda C Walke
(74) *Attorney, Agent, or Firm* — Sughrue Mion, PLLC

(57) ABSTRACT

A resist removal method includes removing a resist provided on a photomask substrate by bringing a resist removing liquid into contact with the resist in patterning of a photomask for EUV lithography in which the resist removing liquid contains an alkali compound, a specific nitrogen-containing compound, and water, and a content of the water is more than 50% by mass.

27 Claims, 6 Drawing Sheets

(51) Int. Cl.
    *G03F 1/22*     (2012.01)
    *C11D 11/00*     (2006.01)
    *C11D 7/32*     (2006.01)

(56) References Cited

U.S. PATENT DOCUMENTS

| | | | | |
|---|---|---|---|---|
| 2006/0223309 | A1* | 10/2006 | Ho | H01L 21/76808 438/652 |
| 2008/0073321 | A1* | 3/2008 | Hyland | H01L 21/0276 216/41 |
| 2009/0061634 | A1* | 3/2009 | Feurprier | H01L 21/31144 438/700 |
| 2009/0181330 | A1* | 7/2009 | Gabor | G03F 7/70433 430/322 |
| 2009/0233226 | A1* | 9/2009 | Allen | G03F 7/0046 430/281.1 |
| 2013/0330927 | A1* | 12/2013 | Kumagai | G03F 7/425 438/675 |

FOREIGN PATENT DOCUMENTS

| | | |
|---|---|---|
| JP | 2010-027786 A | 2/2010 |
| JP | 2012-033774 A | 2/2012 |
| JP | 2012-146690 A | 8/2012 |
| JP | 2012-204546 A | 10/2012 |
| JP | 2012-204708 A | 10/2012 |
| KR | 10-2006-0056237 A | 5/2006 |
| KR | 10-2012-0007476 A | 1/2012 |
| WO | 2009/116348 A1 | 9/2009 |

OTHER PUBLICATIONS

International Preliminary Report on Patentability (Chapter II), dated Oct. 17, 2015, issued in corresponding International Application No. PCT/JP2014/059962, 6 pages in English.
International Search Report for PCT/JP2014/059962 dated Jun. 3, 2014 [PCT/ISA/210].
Written Opinion for PCT/JP2014/059962 dated Jun. 3, 2014 [PCT/ISA/237].
Written Opinion of the International Preliminary Examining Authorities for PCT/JP2014/059962 dated Jun. 3, 2014 [PCT/IPEA/408].
International Preliminary Examination Report for PCT/JP2014/059962 dated Jun. 3, 2014 [PCT/IPEA/409].
Communication dated Jun. 28, 2016, from the Japanese Patent Office in counterpart application No. 2013-086743.
Office Action dated Nov. 16, 2016, issued by the Korean Intellectual Property Office in corresponding Korean Application No. 10-2015-7029652.

\* cited by examiner

RESIST REMOVING LIQUID, RESIST REMOVAL METHOD USING SAME AND METHOD FOR PRODUCING PHOTOMASK

CROSS-REFERENCE TO RELATED APPLICATIONS

This application is a Continuation of PCT International Application No. PCT/JP2014/59962, filed on Apr. 4, 2014, which claims priority under 35 U.S.C. §119(a) to Japanese Patent Application No. 2013-086743, filed on Apr. 17, 2013. Each of the above application(s) is hereby expressly incorporated by reference, in its entirety, into the present application.

BACKGROUND OF THE INVENTION

1. Field of the Invention

The present invention relates to a resist removing liquid, a resist removal method using the same, and a method for producing a photomask.

2. Description of the Related Art

A circuit pattern has been transferred onto a silicon wafer by transmitting light such as a g-ray, an i-ray, an excimer laser, and the like from a high pressure mercury lamp, which has been used for exposure during semiconductor production, through a photomask. On the other hand, EUV light is absorbed by most materials. Therefore, a transmission type mask exposure technique of the related art cannot be employed and a method for forming a circuit pattern by reflecting light has been employed.

Specifically, the above-described EUV exposure is performed by using a reflection type mask employing a reflection projection optical system and making exposure light incident on the mask. The silicon wafer (semiconductor substrate) is irradiated with the light at a reflection angle which is equal to the incident angle. As described above, since the exposure methods are completely different from each other, the structure and the material of the photomask are significantly changed along with a change from a transmission type to a reflection type. In WO2009/116348A, there is disclosed a photomask for EUV exposure.

SUMMARY OF THE INVENTION

An investigation on a processing technique of a photomask for EUV lithography has just been started and specific findings and techniques have not been accumulated. For example, even in WO2009/116348A, there are descriptions of the structure of the photomask and a series of processing procedures but there are no descriptions of a resist material used in the patterning and a removal method of the resist material.

In consideration of the circumstances, an object of the present invention is to provide a resist removing liquid having excellent removal performance of a resist used in the patterning of a photomask for EUV lithography, a resist removal method using the same, and a method for producing a photomask.

The above-mentioned problems are solved by the following means.

[1] A resist removal method including: removing a resist provided on a photomask substrate by bringing a resist removing liquid into contact with the resist in patterning of a photomask for EUV lithography, in which the resist removing liquid contains an alkali compound, a specific nitrogen-containing compound, and water, and a content of the water is more than 50% by mass.

[2] The resist removal method according to [1], in which the specific nitrogen-containing compound has a primary amine structure ($-NH_2$), a secondary amine structure ($>NH$), a tertiary amine structure ($>N-$), or a quaternary ammonium structure ($>N^+<$).

[3] The resist removal method according to [1] or [2], in which the alkali compound is a quaternary ammonium hydroxide.

[4] The resist removal method according to any one of [1] to [3], in which the molecular weight of the specific nitrogen-containing compound is 300 or more and 20,000 or less.

[5] The resist removal method according to any one of [1] to [4], in which the specific nitrogen-containing compound is a compound represented by any of the following formulae (a-1) to (a-10).

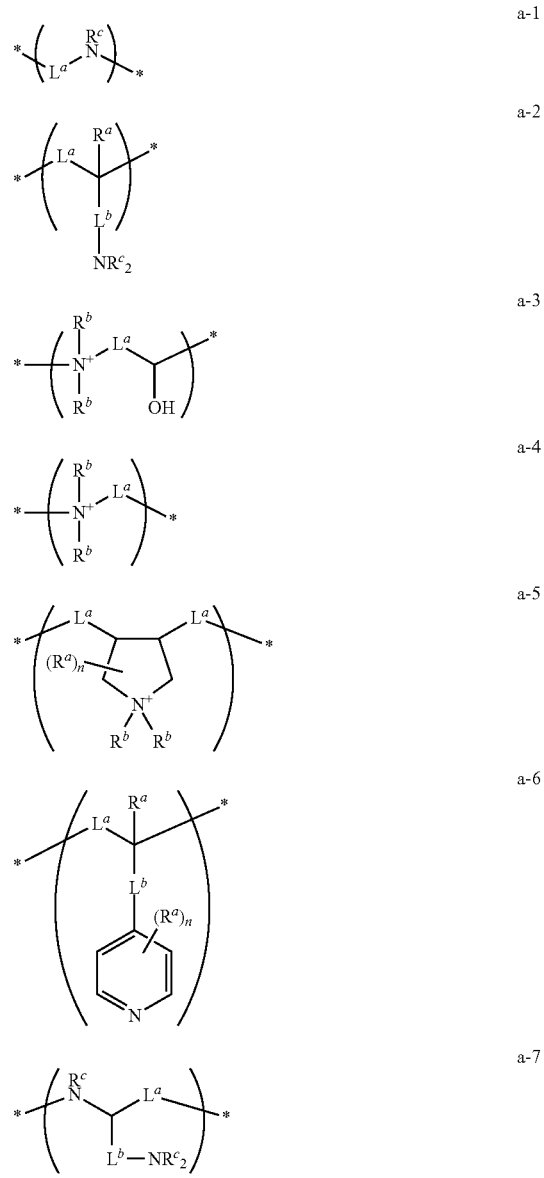

-continued

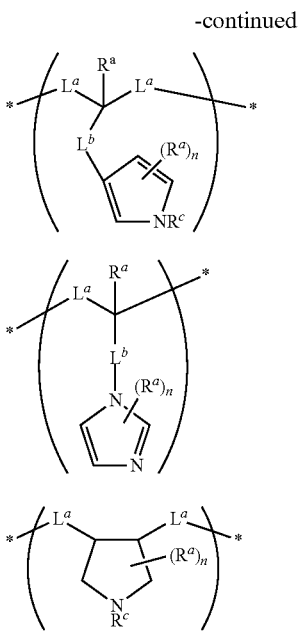

[$R^a$ represents a hydrogen atom, an alkyl group, an alkenyl group, an aryl group or a heterocyclic group. $R^b$ represents an alkyl group or an alkenyl group. $L^a$ represents an alkylene group, a carbonyl group, an imino group, an arylene group, a heterocyclic group, or a combination thereof. $L^b$ represents a single bond, an alkylene group, a carbonyl group, an imino group, an arylene group, a heterocyclic group, or a combination thereof. $R^c$ represents a hydrogen atom or an alkyl group. n represents an integer of 0 or more.]

[6] The resist removal method according to any one of [1] to [4], in which the specific nitrogen-containing compound is a compound represented by the following formula (b).

$$R^c{}_2N-[L^d-N(R^c)]_m-L^d-NR^c{}_2 \qquad (b)$$

[In the formula, $R^c$ represents a hydrogen atom or an alkyl group, m represents an integer of 0 or more. $L^d$ represents an alkylene group, a carbonyl group, an imino group, an arylene group, a heterocyclic group, or a combination thereof.]

[7] The resist removal method according to any one of [1] to [6], in which the resist is removed at a treatment temperature of 15° C. to 60° C.

[8] The resist removal method according to any one of [1] to [7], in which when the resist removing liquid is brought into contact with the resist on the photomask substrate to remove the resist, the resist removing liquid is brought into contact with the resist by being discharged, ejected, flowed down or dropped.

[9] The resist removal method according to any one of [1] to [8], in which the resist is a resin composition containing a polymer compound having a phenol structure.

[10] A method for producing a photomask for EUV lithography including: preparing the photomask for EUV lithography a through a process of removing a resist by the resist removal method according to any one of [1] to [9].

[11] The method for producing a photomask according to [10], further including: a process of forming a photomask substrate by providing a reflecting layer, a protective layer, and an absorbing layer in this order on a base substrate, a process of providing a resist on an upper side of the absorbing layer of the photomask substrate, a process of etching a portion of the absorbing layer in which the resist is not provided, and a process of removing the resist with a resist removing liquid.

[12] A resist removing liquid that is a resist removing liquid used in patterning of a photomask for EUV lithography, the liquid including: an alkali compound, a specific nitrogen-containing compound, and water, in which a content of the water is more than 50% by mass.

[13] The resist removing liquid according to [12], in which the specific nitrogen-containing compound has a primary amine structure (—$NH_2$), a secondary amine structure (>NH), a tertiary amine structure (>N—), or a quaternary ammonium structure (>$N^+$<).

[14] The resist removing liquid according to [12] or [13], in which the alkali compound is a quaternary ammonium hydroxide.

[15] The resist removing liquid according to any one of [12] to [14], in which the molecular weight of the specific nitrogen-containing compound is 300 or more and 20,000 or less.

[16] The resist removing liquid according to any one of [12] to [15], in which the specific nitrogen-containing compound is a compound represented by any of the following formulae (a-1) to (a-10).

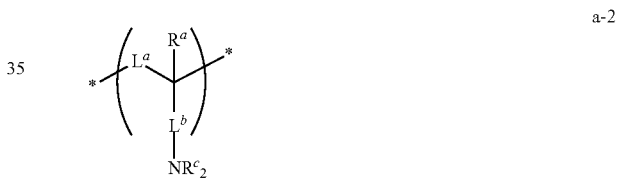

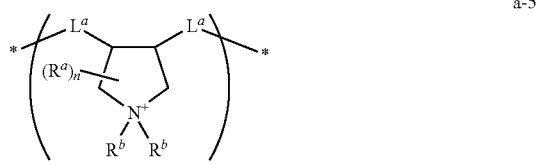

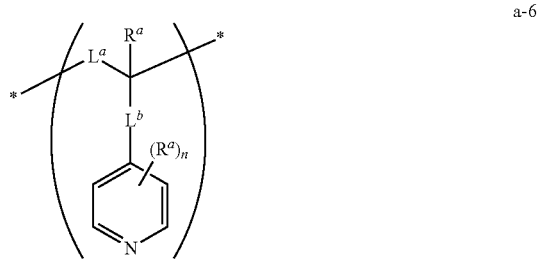

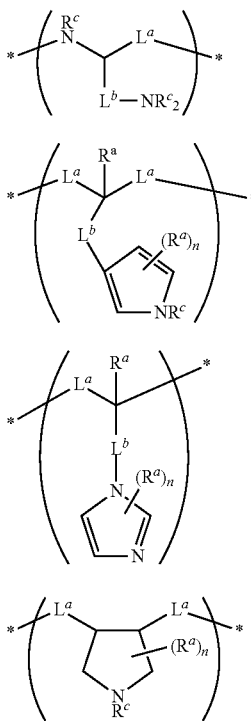

[$R^a$ represents a hydrogen atom, an alkyl group, an alkenyl group, an aryl group or a heterocyclic group. $R^b$ represents an alkyl group or an alkenyl group. $L^a$ represents an alkylene group, a carbonyl group, an imino group, an arylene group, a heterocyclic group, or a combination thereof. $L^b$ represents a single bond, an alkylene group, a carbonyl group, an imino group, an arylene group, a heterocyclic group, or a combination thereof. $R^c$ represents a hydrogen atom or an alkyl group. n represents an integer of 0 or more.]

[17] The resist removing liquid according to any one of [12] to [15], in which the specific nitrogen-containing compound is a compound represented by the following formula (b).

[In the formula, $R^c$ represents a hydrogen atom or an alkyl group. m represents an integer of 0 or more. $L^d$ represents an alkylene group, a carbonyl group, an imino group, an arylene group, a heterocyclic group, or a combination thereof.]

[18] The resist removing liquid according to any one of [12] to [17] containing 0.5% by mass to 40% by mass of the alkali compound.

[19] The resist removing liquid according to any one of [12] to [18] containing 0.01% by mass to 20% by mass of the specific nitrogen-containing compound.

[20] The resist removing liquid according to any one of [12] to [19], in which the resist used in the patterning of the photomask for EUV lithography is a resin composition containing a polymer compound having a phenol structure.

The resist removing liquid of the present invention has excellent removal performance of a resist used in the patterning of a photomask for EUV lithography. In addition, according to the resist removal method of the present invention, it is possible to produce a photomask for EUV lithography with high efficiency and good quality by suitably removing a resist using the above-described removing liquid.

DESCRIPTION OF THE PREFERRED EMBODIMENTS

Figure 1:
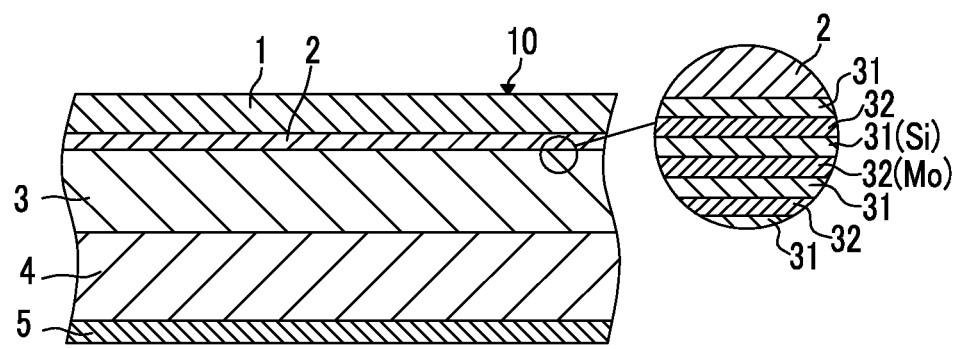
FIG. 1 is a sectional view schematically showing a process for producing a photomask for EUV lithography according to an embodiment of the present invention.
Figure 2:
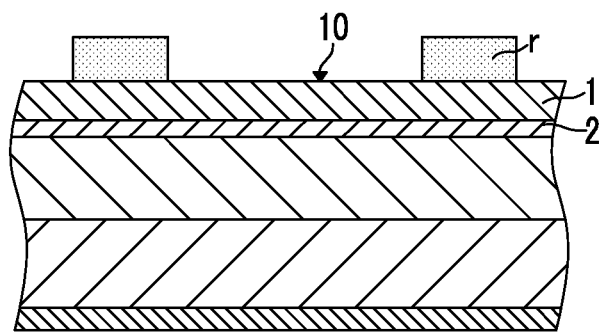
FIG. 2 is a sectional view schematically showing the production process subsequent to FIG. 1.

A resist removing liquid of the present invention contains a specific nitrogen-containing compound and has a specific content of water. A resist used in the production of a photomask for EUV lithography can be suitably removed by using this resist removing liquid and a high quality photomask can be produced with high efficiency. Hereinafter, a preferable embodiment of the present invention will be described in detail including drawings.

<Process of Producing Photomask for EUV Lithography>

FIGS. 1 to 4 are sectional views schematically showing a process of producing a photomask for EUV lithography according to an embodiment of the present invention. In the drawings, in the production of a photomask, stages in which corresponding processing has already proceeded are shown. In a photomask substrate 10 in the state shown in the drawings, a reflecting layer 3, a protective layer 2, and an absorbing layer 1 are already sequentially arranged on the upper side of a glass substrate (base substrate) 4. On the rear side (lower surface) of the glass substrate, a conductive layer 5 is formed. The reflecting layer 3 has a structure in which a layer 31 of silicon (Si) and a layer 32 of molybdenum (Mo) are alternately laminated in a multilayer. By laminating layers of materials having different optical properties in this manner, the reflecting layer 3 can exhibit satisfactory EUV light reflectivity. In the embodiment, a photomask substrate having a structure in which the above-described five layers are laminated is shown. However, the present invention is not limited thereto. For example, another functional layer may be arranged among each layer or another layer may be provided on the outer side (lower side) of the conductive layer 5 or the outer side (upper side) of the absorbing layer 1.

Glass Substrate (Base Substrate)

The size of each member in the photomask substrate 10 is not particularly limited and the glass substrate 4 preferably has a circle equivalent diameter of about 1 mm to 10 mm. It is preferable to use a material having high flatness and low thermal expansion so that unevenness in the reflection properties of EUV light does not arise. Specifically, a thermal expansion coefficient at 20° C. is preferably $0\pm0.05\times10^{-7}/°C.$ and more preferably $0\pm0.03\times10^{-7}/°C.$ As for the glass substrate 4, glass having a low thermal expansion coefficient, for example, SiO$_2$—TiO$_2$-based glass can be used. However, there is no limitation thereto and substrates of crystallized glass in which a β quartz solid solution is precipitated, quartz glass, silicon, metal and the like can be used. This glass substrate 4 may have a structure of plural divided layers. In this case, the production conditions for each layer of the glass substrate 4 can be appropriately adjusted to impart desired properties.

Conductive Layer

The conductive layer 5 is not particularly limited as long as the conductive layer is composed of a conductive material. Specifically, the conductive layer is preferably formed with a material composed of at least one element selected from the group consisting of chromium (Cr), tantalum (Ta), titanium (Ti), molybdenum (Mo), aluminum (Al) and silicon (Si). Alternatively, the conductive layer preferably contains the above-described materials and at least one element selected from the group consisting of nitrogen (N), oxygen (O), boron (B) and hydrogen (H). As a forming method, for example, known film forming methods such as a magnetron sputtering method and an ion beam sputtering method can be used for film formation. The layer is preferably formed to have a thickness of 50 nm to 100 nm.

Reflecting Layer

It is preferable that the reflectivity of an EUV light beam is high and the surface roughness is small in the reflecting layer 3. Specifically, in the reflecting layer 3, the maximum value of the reflectivity of a light beam near a wavelength of 13.5 nm is preferably 60% or more and more preferably 65% or more. The reflecting layer 3 typically employs a structure in which a layer of high refractive index and a layer of low refractive index are alternately laminated plural times. For a layer 32 of high refractive index, Mo is widely used and for a layer 31 of low refractive index, Si is widely used. Additionally, a Ru/Si multilayer reflecting film, a Mo/Be multilayer reflecting film, a Mo compound/Si compound multilayer reflecting film, a Si/Mo/Ru multilayer reflecting film, a Si/Mo/Ru/Mo multilayer reflecting film, and a Si/Ru/Mo/Ru multilayer reflecting film can also be used. The thickness of each of the layer of high refractive index and the layer of low refractive index is preferably 0.5 nm to 10 nm and more preferably 1 nm to 8 nm. Each layer that forms the reflecting layer 3 may be formed using known film forming methods such as a magnetron sputtering method and an ion beam sputtering method so as to have a desired thickness. The number of layer laminated layers is preferably 20 to 200 in total of both the layer of high refractive index and the layer of low refractive index and more preferably 50 to 150.

Protective Layer

The protective layer 2 is a layer which becomes a stopper (a layer which functions as a stopper) when a pattern is formed on the absorbing layer 1 by an etching process (dry etching process). The protective layer 2 is a layer for protecting the reflecting layer 3 provided on the lower side of the protective layer 2 from damage. As a material for the protective layer 2, a material whose etching rate is lower than the etching rate of the absorbing layer 1 is preferable. Accordingly, the protective layer can protect the reflecting layer 3 therebelow. Examples of the material to be applied to the protective layer 2 include Cr, Al, Ta, nitrides thereof, Ru, a Ru compound (such as RuB or RuSi), and SiO$_2$, Si$_3$N$_4$, Al$_2$O$_3$, and a mixture thereof. Among these, Ru, a Ru compound (such as RuB or RuSi), CrN, or SiO$_2$ is preferable and Ru or a Ru compound (such as RuB or RuSi) is particularly preferable.

The thickness of the protective layer 2 is preferably 1 nm to 60 nm and more preferably 1 nm to 20 nm. The protective layer 2 can be formed using known film forming methods such as a magnetron sputtering method and an ion beam sputtering method.

Absorbing Layer

It is preferable that the reflectivity of an EUV light beam is low in the absorbing layer 1. Specifically, the maximum light beam reflectivity near a wavelength of 13.5 nm is preferably 0.5% or less and more preferably 0.1% or less. The absorbing layer 1 preferably contains tantalum (Ta). The absorbing layer 1 may contain nitrogen (N), boron (B), oxygen (O), and hydrogen (H) as required. The ratio of each element may be appropriately adjusted as required. It is preferable to form a film composed of TaBO, TaBN, TaNO and TaN when these elements are shown as components. The thickness of the absorbing layer 1 is preferably 20 nm to 200 nm, particularly preferably 30 nm to 100 nm, and more preferably 45 nm to 80 nm. The formation method is not particularly limited. For example, the absorbing layer can be formed by performing a sputtering method using a target.

EUV

In the specification, EUV (light) refers to a light beam having a wavelength in a soft X-ray range or a vacuum ultraviolet range and specifically refers to a light beam having a wavelength of about 10 nm to 20 nm, particularly, about 13.5 nm±0.3 nm. EUV is likely to be absorbed by most materials and the refractive index of the material at this wavelength is close to 1. Thus, a refracting optical system cannot be used in photolithography of the related art using visible light or ultraviolet light. Therefore, as described above, in EUV lithography, a reflecting optical system, that is, a reflection type photomask and a mirror are used.

Resist

Figure 3:
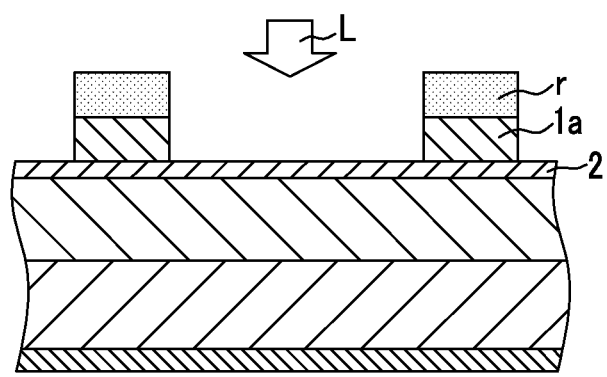
FIG. 3 is a sectional view schematically showing the production process subsequent to FIG. 2.
Figure 4:
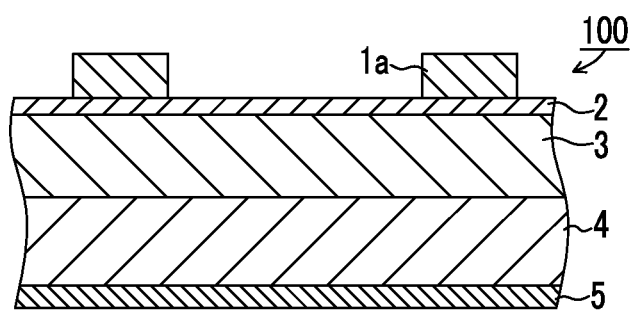
FIG. 4 is a sectional view schematically showing the production process subsequent to FIG. 3.

In the embodiment, a resist layer r is formed on the upper side of the absorbing layer 1. At this time, patterning can be performed by forming the resist layer r not on the entire surface of the absorbing layer 1 but only in a desired portion. In FIG. 3, a state in which dry etching is performed on the resist as a mask from above and the absorbing layer 1 is patterned (patterned absorbing layer 1a) is shown. Dry etching is preferably performed according to a typical method and examples thereof include a method of processing the resist layer r as an etching mask with a dry etching apparatus (Tetra 2, product name, manufactured by Applied Materials, Inc.). Specific conditions are such that the pressure is set to 15 mTorr, the ICP power is set to 500 W, the bias power is set to 13 W, the amount of chlorine is set to 90 sccm, the amount of oxygen is set to 30 sccm, and the time is set to 300 seconds. Alternatively, plasma RF etching (bias RF: 50 W, etching time: 120 sec, trigger pressure: 3 Pa, etching pressure: 1 Pa, etching gas: Cl$_2$/Ar, gas flow rate (Cl$_2$/Ar): 20/80 sccm, and distance between electrode and substrate: 55 mm) can be performed.

Next, a removing liquid L is applied to the remaining resist layer r and both are brought into contact with each other to remove the resist. In the present invention, since a liquid having a specific combination is employed as the removing liquid L, the resist can be effectively removed. Particularly, in the removal of a resist of a photomask for EUV lithography, it is required that damaging properties to a metal film be low. In contrast, there is a high possibility that a strong acid or strong alkali solution which is generally used in the removal of a resist can damage metal and simply from the viewpoint of only resist removal performance, it is difficult to use a strong acid or strong alkali solution for a resist of a photomask for EUV lithography. Particularly, the original size design is set to be small in the generation of EUV lithography. Thus, even when the absorbing layer 1

(for example, a layer of TaN or TaBN) is slightly damaged, there is an unignorable impact on the quality. In addition, when the protective layer 2 (for example, a Ru layer) is damaged, the EUV reflectivity is changed and the illuminance and the energy are changed at the time of EUV exposure. Hereinafter, a preferable embodiment of the resist removing liquid of the present invention will be described in more detail.

In the specification, the meaning of the term "photomask" includes a finished product obtained by processing a photomask substrate and also includes an intermediate product. The term "photomask substrate", "substrate" or "base substrate" refers to an intermediate product that is formed with a material constituting the photomask. When the terms "photomask" and "photomask substrate" are distinguished from each other, an unfinished product including the conductive layer 5, the glass substrate 4, the reflecting layer 3, the protective layer 2 and the absorbing layer 1 shown in FIG. 1 is referred to as a photomask substrate, and a product obtained by completing processing subsequent to the process of FIG. 3 or a completed product is referred to as a photomask. More specifically, only a member corresponding to the glass substrate 4 is referred to as a substrate or a base substrate and a member in which other members (the glass substrate 4, the reflecting layer 3, the protective layer 2 and the absorbing layer 1) are arranged is referred to as a photomask substrate. The meaning of the terms "upper" and "lower" is not limited and unless it is explicitly stated otherwise, the side of the resist is referred to as an "upper side" and the side of the substrate 4 is referred to as a "lower side" as seen in FIG. 1.

Regarding the above-described production process and material of the photomask for EUV lithography, descriptions of WO2009/116348A and JP2011-222612A can be referred to.

[Resist Removing Liquid]

(Alkali Compound)

The alkali compound is not particularly limited as long as the compound is a material which makes the inside system of an aqueous medium alkaline, and may be an organic base or an inorganic base. Examples of the inorganic base include salts of alkali metals (for example, KOH, LiOH, and NaOH), salts of alkaline earth metals (for example, Ca(OH)$_2$, and Mg(OH)$_2$), and an ammonium salt (NH$_4$OH).

As the organic base, there is an organic onium salt. Examples of the organic onium salt include nitrogen-containing onium salts (quaternary ammonium salt), phosphorus-containing onium salts (quaternary phosphonium salt), and sulfur-containing onium salts (for example, SRy$_3$M: Ry represents an alkyl group having 1 to 6 carbon atoms, and M represents a counter anion). Among these, nitrogen-containing onium salts (quaternary ammonium salt, pyridinium salt, pyrazolium salt, imidazolium salt) are preferable.

Among these, the alkali compound is preferably a quaternary ammonium hydroxide.

As the quaternary ammonium hydroxide, a tetraalkylammonium hydroxide (preferably having 4 to 25 carbon atoms) is preferable. At this time, an arbitrary substituent (for example, a hydroxyl group, an allyl group, or an aryl group) may be substituted in the alkyl group within a range not impairing the effect of the present invention. In addition, the alkyl group may be a linear, branched or cyclic alkyl group. Specific examples include tetramethylammonium hydroxide (TMAH), tetraethylammonium hydroxide (TEAH), benzyltrimethylammonium hydroxide, ethyltrimethylammonium hydroxide, 2-hydroxyethyltrimethylammonium hydroxide, benzyltriethylammonium hydroxide, hexadecyltrimethylammonium hydroxide, tetrabutylammonium hydroxide (TBAH), tetrahexylammonium hydroxide (THAH), and tetrapropyl ammonium hydroxide (TPAH).

Among these, tetraalkylammonium hydroxides having three or more methyl groups and/or ethyl groups are more preferable. Tetramethylammonium hydroxide or ethyltrimethylammonium hydroxide is most preferable.

The amount of the alkali compound contained is preferably 0.5% by mass or more, more preferably 1% by mass or more, and particularly preferably 2% by mass or more with respect to the total mass of the removing liquid L of the embodiment. The upper limit is preferably 40% by mass or less, more preferably 30% by mass or less, and still more preferably 20% by mass or less. In the case in which the amount of the compound is the above-mentioned lower limit or more, sufficient resist removal performance can be obtained and thus this case is preferable. In the case in which the amount of the compound is the above-mentioned upper limit or less, from the viewpoint of obtaining a stable chemical solution over time, this case is preferable. The molecular weight of the alkali compound is preferably 500 or less, more preferably 400 or less, and particularly preferably 310 or less. The lower limit is substantially 50 or more. The definition of the molecular weight is the same as the definition in a specific nitrogen-containing compound which will be described later.

(Specific Nitrogen-Containing Compound)

The specific nitrogen-containing compound preferably has a primary amine structure (—NH$_2$), a secondary amine structure (>NH), a tertiary amine structure (>N—), a quaternary ammonium structure (>N$^+$<) or a combination thereof (these structures are generally referred to as "specific amine structures"). According to the preferable embodiment of the present invention, while the removal performance of the resist of the photomask for EUV lithography is suitably maintained by the above-mentioned alkali compound and a combination with the specific nitrogen-containing compound, a satisfactory condition can be maintained without damaging the protective layer 2 (a metal layer of ruthenium) and the absorbing layer 1 (a layer containing tantalum).

When the specific nitrogen-containing compound is a polyelectrolyte, a cationic surfactant having a hydrophilic nitrogen-containing group and a hydrophobic terminal group can be exemplified. The polyelectrolyte preferably has a repeating unit having the above-mentioned specific amine structure. More specifically, the polyelectrolyte preferably contains a repeating unit including a functional group selected from the group consisting of an amine group (—NRx$_2$: Rx represents a hydrogen atom or an alkyl group having 1 to 6 carbon atoms), an amide group (—CONRx), an imide group (—CONRxCO—), an imino group (—NRx-), an alkylene imino group (—N(Rx)Lx-: Lx represents an alkylene group having 1 to 6 carbon atoms) and a hydroxy alkylene imino group (—NRx)Ly-: Ly represents an alkylene group having a hydroxy group having 1 to 6 carbon atoms).

The number of the repeating unit having a specific amine structure present in the polyelectrolyte is preferably 40% or more of the total number of repeating units and more preferably 50% or more of the total number of repeating units. The upper limit is not particularly limited but is preferably 100% or less.

The polyelectrolyte may be a homopolymer or a copolymer which contains the above-mentioned repeating unit. Alternatively, the polyelectrolyte may further have another repeating unit (preferably a nonionic repeating unit). Examples of another repeating unit include an ethylene oxide group, a propylene oxide group, and a styrene-derived repeating unit. The number of nonionic repeating units present in the polyelectrolyte is preferably 99% or less of the total number of repeating units and more preferably 90% or less of the total number of repeating units. The lower limit is not particularly limited but may be 0% or more since the unit is an arbitrary repeating unit.

The polyelectrolyte may further contain another repeating unit. Examples of another repeating unit that may be further included in the polyelectrolyte include a repeating unit having a hydroxy group, a phosphonic acid group (or a salt thereof), a sulfonic acid group (or a salt thereof), a phosphonic acid group (or a salt thereof), or a carboxylic acid group (or a salt thereof).

The polyelectrolyte may be any one of a homopolymer, a random copolymer, an alternating copolymer, a periodic copolymer, a block copolymer, (for example, AB, ABA, and ABC), a graft copolymer and a comb copolymer.

The constituent unit including the above-mentioned specific amine structure is preferably a unit selected from the following formulae (a-1) to (a-10).

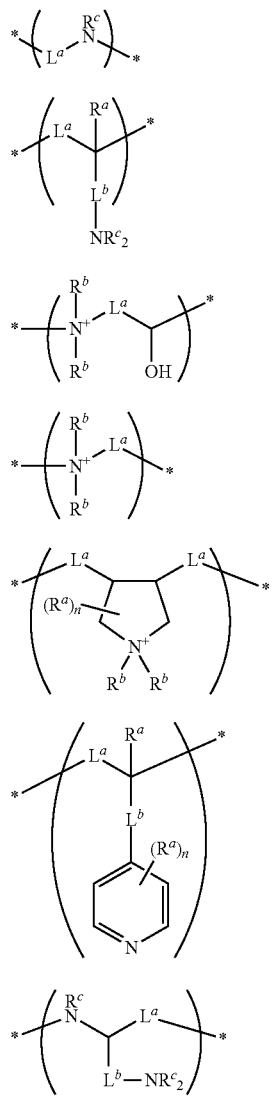

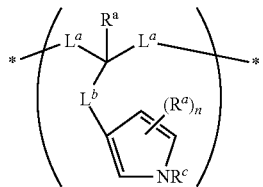

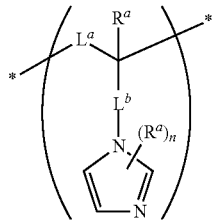

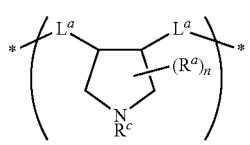

$R^a$ $R^a$ represents a hydrogen atom, an alkly group (preferably having 1 to 12 carbon atoms, more preferably having 1 to 6 carbon atoms, and particularly preferably having 1 to 3 carbon atoms), an alkenyl group (preferably having 2 to 12 carbon atoms and more preferably having 2 to 6 carbon atoms), an aryl group (preferably having 6 to 22 carbon atoms and more preferably having 6 to 14 carbon atoms), or a heterocyclic group (preferably having 2 to 12 carbon atoms and more preferably having 2 to 6 carbon atoms). Among these, $R^a$ is preferably a hydrogen atom or a methyl group. In the specification, the meaning of an alkyl group includes an aralkyl group.

$R^b$ $R^b$ represents an alkyl group (preferably having 1 to 12 carbon atoms, more preferably having 1 to 6 carbon atoms, and particularly preferably having 1 to 3 carbon atoms) or an alkenyl group (preferably having 2 to 12 carbon atoms and more preferably having 2 to 6 carbon atoms). Among these, $R^b$ is preferably a methyl group or an ethyl group.

$L^a$ $L^a$ represents an alkylene group (preferably having 1 to 12 carbon atoms, more preferably having 1 to 6 carbon atoms, and particularly preferably having 1 to 3 carbon atoms), a carbonyl group, an imino group (preferably having 0 to 6 carbon atoms and more preferably having 0 to 3 carbon atoms), an arylene group (preferably having 6 to 22 carbon atoms and more preferably having 6 to 14 carbon atoms), a heterocyclic group (preferably having 1 to 12 carbon atoms and more preferably having 2 to 5 carbon atoms), or a combination thereof. Among these, an alkylene group or a carbonyl group is preferable, a methylene group, an ethylene group, a propylene group, or a carbonyl group is more preferable, a methylene group or an ethylene group is still more preferable, and a methylene group is particularly preferable.

$L^b$ $L^b$ represents a single bond, an alkylene group (preferably having 1 to 12 carbon atoms, more preferably having 1 to 6 carbon atoms, and particularly preferably having 1 to 3 carbon atoms), a carbonyl group, an imino group (preferably having 0 to 6 carbon atoms and more preferably having 0 to 3 carbon atoms), an arylene group (preferably having 6 to 22 carbon atoms and more preferably having 6 to 14 carbon atoms), a heterocyclic group (preferably having 1 to 12 carbon atoms and more preferably having 2 to 5 carbon atoms), or a combination thereof. Among these, a single bond, a methylene group, an ethylene group, a propylene group, or a carbonyl group is preferable and a single bond, a methylene group or an ethylene group is more preferable.

$R^c$ $R^c$ represents a hydrogen atom or an alkyl group (preferably having 1 to 12 carbon atoms, more preferably having 1 to 6 carbon atoms, and particularly preferably having 1 to 3 carbon atoms). Among these, $R^c$ is preferably a hydrogen atom or a methyl group.

n n represents an integer of 0 or more. The upper limit of n is a substitutable number of each cyclic structure portion. For example, in formulae (a-5) and (a-6), the upper limit is 4, and in formulae (a-8) and (a-9), the upper limit is 3.

When plural $R^a$s, $R^b$s, $R^c$s, $L^a$s, and $L^b$s are present in a molecule, plural $R^a$s, $R^b$s, $R^c$s, $L^a$s, and $L^b$s may be the same or different. Plural $R^a$s, $R^b$s and $R^c$s may be combined together to form a ring. Unless otherwise specified, within a range not impairing the effect of the present invention, adjacent substituents and linking groups may be combined together to form a ring.

Further, the above-mentioned specific nitrogen-containing compound is preferably represented by the following formula (b).

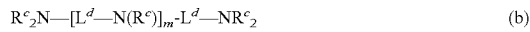

In the formula, $R^c$ is the same as in the above description. m represents an integer of 0 or more and preferably 2 to 10, and more preferably 3 to 6.

$L^d$ represents an alkylene group (preferably having 1 to 12 carbon atoms, more preferably having 1 to 6 carbon atoms, and particularly preferably having 1 to 3 carbon atoms), a carbonyl group, an imino group (preferably having 0 to 6 carbon atoms and more preferably having 0 to 3 carbon atoms), an arylene group (preferably having 6 to 22 carbon atoms and more preferably having 6 to 14 carbon atoms), a heterocyclic group (preferably having 1 to 12 carbon atoms and more preferably having 2 to 5 carbon atoms), or a combination thereof. Among these, an alkylene group is preferable and a methylene group, an ethylene group, or a propylene group is more preferable.

Plural $R^c$s and $L^d$s may be the same or different. Plural $R^c$s and $L^d$s may combine together to form a ring.

The concentration of the specific nitrogen-containing compound is preferably 0.001% by mass or more, more preferably 0.01% by mass or more, and particularly preferably 0.1% by mass or more, with respect to the total mass of the removing liquid. The upper limit of the concentration is preferably 20% by mass or less, more preferably 10% by mass or less, and particularly preferably 7% by mass or less. When the concentration is the above-mentioned lower limit or more, a sufficient substrate protecting effect can be obtained. When the concentration is the above-mentioned upper limit or less, a sufficient resist removing effect can be obtained.

From the same viewpoint as in the above description, the amount of the specific nitrogen-containing compound is preferably 0.1 parts by mass or more, more preferably 1 part by mass or more, and particularly preferably 5 parts by mass or more with respect to 100 parts by mass of the alkali compound. The upper limit is preferably 500 parts by mass or less, more preferably 200 parts by mass or less, and particularly preferably 100 parts by mass or less.

In the present invention, it is important to provide a removing liquid and a removal method of a resist particularly suitable for a photomask for EUV lithography. As described above, damage prevention is highly required for the absorbing layer and the protective layer. The reason for exhibiting a high effect by solving the above problem by the present invention is not clear but it can be thought that the specific nitrogen-containing compound employed as an essential component in the removing liquid mainly containing water has a high affinity with the absorbing layer 1 (TaN, TaBN) and the protective layer 2 (Ru), and protection performance against the alkali compound can be realized by adherence of the compound to the surface of the layers. On the other hand, since the affinity is suppressed with respect to the resist and water is a main component, it is assumed that the amount of the specific nitrogen-containing compound blended is relatively suppressed and thus the removal performance is suitably maintained.

The molecular weight of the specific nitrogen-containing compound is preferably 50 or more, more preferably 100 or more, still more preferably 300 or more, and particularly preferably 500 or more. The upper limit is preferably 50,000 or less, more preferably 30,000 or less, and particularly preferably 20,000 or less. When the molecular weight is within this range, substrate protection performance can be exhibited while suitably maintaining resist removal performance. Thus this case is preferable.

[Measurement of Molecular Weight]

Regarding a commercially available compound, a molecular weight calculated from a chemical structure described in a catalog is applied. In the case in which the chemical structure is not clear, a method of performing column separation using LC-MS and then determining the molecular weight using mass spectrometry is applied. In addition, when the molecular weight is large and mass spectrometry analysis is difficult, the weight average molecular weight in terms of polystyrene is measured by GPC. The weight average molecular weight is detected by RI at a flow rate of 1 mL/min at 23° C. using a GPC apparatus HLC-8220 (manufactured by Tosoh Corporation), tetrahydrofuran (THF) (manufactured by Shonan Wako Pure Chemical Industries, Ltd.) as an eluent, and G3000HXL+ G2000HXL as columns. Examples of a solvent (carrier) for GPC include N-methylpyrrolidone, acetonitrile, and formamide. In the case in which a solvent is not dissolved in THF, a solvent may be appropriately selected according to the physical properties of a polymer compound which is a measurement target.

In the specific nitrogen-containing compound, pKa of the conjugate acid thereof is preferably 5 or more and more preferably 6 or more. Although the upper limit is not particularly limited, the upper limit is practically 14 or less.

Herein, the term "pKa" refers to pKa in an aqueous solution, for example, any of those listed in Kagaku Binran (Chemical Handbook) (II) (Revised 4th Edition, 1993, edited by The Chemical Society of Japan, published by Maruzen Co., Ltd.). The lower the value is, the greater the acid strength is. Specifically, the pKa in an aqueous solution can be actually measured through the determination of the acid dissociation constant at 25° C. using an infinitely diluted aqueous solution. The acid dissociation constant can be obtained from the pH dependency of electrical conductivity of an aqueous solution as described in the 5th edition Jikken Kagaku Koza (edited by the Chemical Society of Japan, published by Maruzen Co., Ltd., Vol. 20-1, p. 65). In addition, in the case in which a nitrogen-containing compound is a polymer, the acid dissociation constant also can be defined by the pKa of the nitrogen-containing monomer compound which constitutes a basis of a repeating structure. In this case, when plural types of nitrogen-containing monomers are copolymerized, the acid dissociation constant can be represented by the pKa of a nitrogen-containing monomer derived from a nitrogen-containing repeating unit which is contained most in the polymer.

Hereinafter, specific examples of the specific nitrogen-containing compound will be shown but these examples should not be interpreted as limiting the present invention.

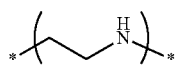

A-1

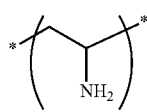

A-2

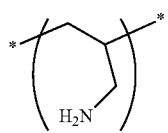

A-3

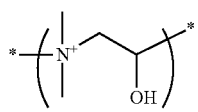

A-4

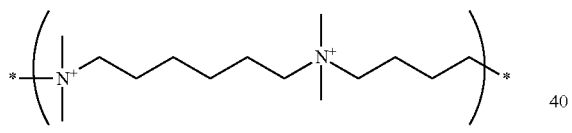

A-5

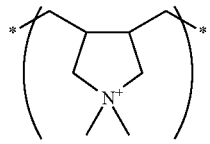

A-6

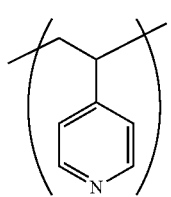

A-7

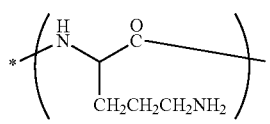

A-8

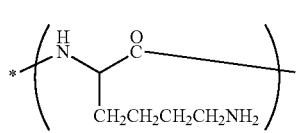

A-9

-continued

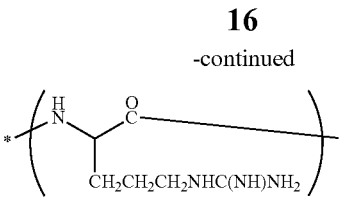

A-10

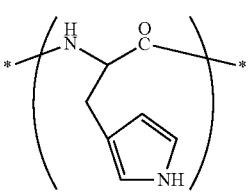

A-11

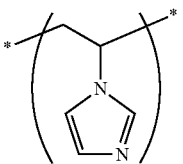

A-12

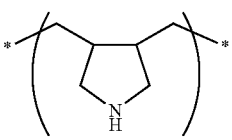

A-13

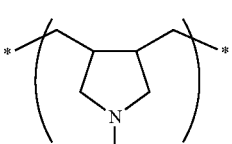

A-14

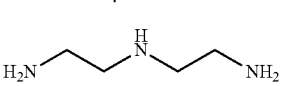

A-15

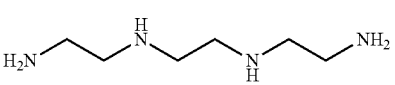

A-16

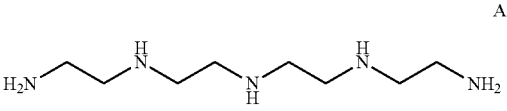

A-17

A-1 Polyethyleneimine
A-2 Polyvinylamine
A-3 Polyallylamine
A-4 Dimethylamine epihydrin-based polymer
A-5 Polyhexadimethrine
A-6 Polydimethyldiallylammonium (salt)
A-7 Poly(4-vinylpyridine)
A-8 Polyornithine
A-9 Polylysine
A-10 Polyarginine
A-11 Polyhistidine
A-12 Polyvinylimidazole
A-13 Polydiallylamine
A-14 Polymethyldiallylamine
A-15 Diethylenetriamine
A-16 Triethylenetetramine
A-17 Tetraethylenepentamine
A-18 Pentaethylenehexamine It is noted that in the specification, the representation of the compound is used in the sense that not only the compound itself, but also its salt and its ion are incorporated therein. Further, it is used in the sense that the compound includes a derivative thereof which is modified in a predetermined part in the range of achieving a desired effect.

In the specification, a substituent or a linking group that is not specified by substitution or non-substitution means that the substituent may have an optional substituent. This is applied to the compound that is not specified by substitution or non-substitution. Preferable examples of the substituent include a substituent T which will be described below.

Examples of the substituent T include the following substituents.

The substituents include an alkyl group (preferably an alkyl group having 1 to 20 carbon atoms, for example, methyl, ethyl, isopropyl, t-butyl, pentyl, heptyl, 1-ethylpentyl, benzyl, 2-ethoxyethyl, and 1-carboxymethyl), an alkenyl group (preferably an alkenyl group having 2 to 20 carbon atoms, for example, vinyl, allyl, and oleyl), an alkynyl group (preferably an alkynyl group having 2 to 20 carbon atoms, for example, ethynyl, butadiynyl, and phenylethynyl), a cycloalkyl group (preferably a cycloalkyl group having 3 to 20 carbon atoms, for example, cyclopropyl, cyclopentyl, cyclohexyl, and 4-methylcyclohexyl), an aryl group (preferably an aryl group having 6 to 26 carbon atoms, for example, phenyl, 1-naphthyl, 4-methoxyphenyl, 2-chlorophenyl, and 3-methylphenyl), a heterocyclic group (preferably a heterocyclic group having 2 to 20 carbon atoms, and preferably a heterocyclic group having 2 to 20 carbon atoms of a 5- or 6-membered ring having at least one oxygen atom, sulfur atom, or nitrogen atom, for example, 2-pyridyl, 4-pyridyl, 2-imidazolyl, 2-benzimidazolyl, 2-thiazolyl, and 2-oxazolyl), an alkoxy group (preferably an alkoxy group having 1 to 20 carbon atoms, for example, methoxy, ethoxy, isopropyloxy, and benzyloxy), an aryloxy group (preferably an aryloxy group having 6 to 26 carbon atoms, for example, phenoxy, 1-naphthyloxy, 3-methylphenoxy, and 4-methoxyphenoxy), an alkoxycarbonyl group (preferably an alkoxycarbonyl group having 2 to 20 carbon atoms, for example, ethoxycarbonyl and 2-ethylhexyloxycarbonyl), an amino group (preferably an amino group having 0 to 20 carbon atoms, an alkyl amino group, and an aryl amino group, for example, amino, N,N-dimethylamino, N,N-diethylamino, N-ethylamino, and anilino), a sulfamoyl group (preferably a sulfamoyl group having 0 to 20 carbon atoms, for example, N,N-dimethylsulfamoyl, and N-phenylsulfamoyl), an acyloxy group (preferably an acyloxy group having 1 to 20 carbon atoms, for example, acethyloxy and benzoyloxy), a carbamoyl group (preferably a carbamoyl group having 1 to 20 carbon atoms, for example, N,N-dimethylcarbamoyl and N-phenylcarbamoyl), an acylamino group (preferably an acylamino group having 1 to 20 carbon atoms, for example, acetylamino and benzoylamino), a sulfonamide group (preferably a sulfamoyl group having 0 to 20 carbon atoms, for example, methane sulfonamide, benzene sulfonamide, N-methylmethanesulfonamide, and N-ethylbenzenesulfonamide), a hydroxy group, and a cyano group, and a halogen atom (for example, a fluorine atom, a chlorine atom, a bromine atom, and an iodine atom). Among them, an alkyl group, an alkenyl group, an aryl group, a heterocyclic group, an alkoxy group, an aryloxy group, an alkoxycarbonyl group, an amino group, an acylamino group, a cyano group, and a halogen atom are more preferable. An alkyl group, an alkenyl group, a heterocyclic group, an alkoxy group, an alkoxycarbonyl group, an amino group, an acylamino group, and a cyano group are particularly preferable.

In the case where a compound, a substituent, a linking group, and the like include an alkyl group, an alkylene group, an alkenyl group, an alkenylene group, and the like, these may be linear or branched, and may be substituted or not substituted as described above. Further, when an aryl group, a heterocyclic group, and the like are include therein, these may be a single ring or a condensed ring, and similarly these may be substituted or not substituted.

(Water)

The removing liquid of the present invention contains water as a medium. In the removing liquid, more than half of the medium is water (more than 50% by mass), and the amount of water is preferably 60% by mass or more. The content of water is more preferably 70% by mass or more, still more preferably 80% by mass or more, and particularly preferably 85% by mass or more. When the content of water is more than half, the content of a dissolving component (specific nitrogen-containing compound) is relatively suppressed and thus the removing liquid is suitable for producing a photomask for EUV photolithography as described above. Further, the removing liquid is advantageous in the environment as a production material and is distinguished from an organic removing liquid in which the content of water is less than 50% by mass including this viewpoint. In the case of considering application for use in photomask production, the smaller the amount of impurities included in the removing liquid is, the more preferable it is. Specifically, it is preferable that a metal content which can influence a photomask, halogen anions ($Cl^-$, $Br^-$ and the like) other than fluorine, and other impurities are as small as possible. As a method for obtaining such water, an ion exchange method and the like are exemplified.

In the consideration of the purpose of the application for removing liquid of the present invention, the smaller the amount of impurities in the liquid is, for example, a metal content or the like, the more preferable it is.

(pH)

The removing liquid of the present invention is alkaline and the pH is preferably 9 or more. The adjustment may be conducted by adjusting amounts of the above-mentioned essential components to be added. However, the adjustment may be conducted by relation to optional components, and the above range may be set using another pH controlling agent, as long as it does not impair the effect of the present invention. The pH of the removing liquid is more preferably 10 or more and still more preferably 11 or more. When the pH is the above-mentioned lower limit or more, sufficient resist removal performance can be obtained and thus this case is preferable.

In the present invention, the pH is a value obtained by measurement at room temperature (25° C.) using F-51 (product name, manufactured by HORIBA, Ltd.), unless it is explicitly stated otherwise. Alternatively, the pH may be a value obtained by measurement in accordance with the JIS Z 8802 measurement method. The time of measurement is not particularly limited. In the case where the pH tends to change over time, the pH is defined as a value obtained by measurement directly (within 5 minutes) after preparation of a liquid. At this time, an initial value may be identified by estimating temporal change using a calibration curve.

(Water-Soluble Organic Compound)

The removing liquid of the present invention may contain a water-soluble organic compound. Examples thereof include alcohol compound solvents such as methyl alcohol, ethyl alcohol, 1-propyl alcohol, 2-propyl alcohol, 2-butanol, ethylene glycol, propylene glycol, glycerol, 1,6-hexanediol, cyclohexanediol, sorbitol, xylitol, 2-methyl-2,4-pentanediol, 1,3-butanediol, and 1,4-butanediol, and ether compound solvents including alkylene glycol alkyl ether (such as ethylene glycol monomethyl ether, ethylene glycol monobutyl ether, diethylene glycol, dipropylene glycol, propylene glycol monomethyl ether, diethylene glycol monomethyl ether, triethylene glycol, polyethylene glycol, propylene glycol monomethyl ether, dipropylene glycol monomethyl ether, tripropylene glycol monomethyl ether, diethylene glycol monobutyl ether, and diethylene glycol monobutyl ether).

Among them, an alcohol compound solvent having 2 to 15 carbon atoms and a hydroxyl group-containing ether compound solvent having 2 to 15 carbon atoms are preferable. An alcohol compound solvent having a hydroxyl group having 2 to 10 carbon atoms and a hydroxyl group-containing ether compound solvent having 2 to 10 carbon atoms are more preferable. Alkylene glycol alkyl ether having 3 to 8 carbon atoms is particularly preferable. The oxygen-containing organic compounds may be used singly or in an appropriate combination of two or more types. In the specification, the compound having both a hydroxyl group (—OH) and an ether group (—O—) in the molecule thereof is basically included in the category of "ether compounds" (this is not referred to as an "alcohol compound"). When being distinguished from both of a hydroxyl group and an ether group particularly, this compound may be referred to as a "hydroxyl group-containing ether compound.

Among these, particularly, diethylene glycol monomethyl ether, tetraethylene glycol dimethyl ether, propylene glycol, and triethylene glycol dimethyl ether are preferable. Among these, diethylene glycol monomethyl ether is more preferable.

It is preferable that the water-soluble organic compound is represented by the following formula (O-1).

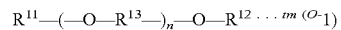

$R^{11}$ $R^{12}$ $R^{11}$ and $R^{12}$ each independently represents a hydrogen atom or an alkyl group having 1 to 5 carbon atoms. Among these, it is preferable that $R^{11}$ and $R^{12}$ are each independently an alkyl group having 1 to 5 carbon atoms. It is more preferable that $R^{11}$ and $R^{12}$ are each independently an alkyl group having 1 to 3 carbon atoms.

$R^{13}$ $R^{13}$ represents a linear or branched alkylene group having 1 to 4 carbon atoms. When plural $R^{13}$s are present, plural $R^{13}$s may be different from each other.

n n is an integer of 1 to 6.

The amount of a compound, which becomes a water-soluble organic solvent, added is preferably 0.1% by mass to 3% by mass and more preferably 1% by mass to 30% by mass with respect to the total amount of the removing liquid.

(Surfactant)

The removing liquid of the present invention may contain a surfactant. The surfactant is not particularly limited. In the case of an anionic surfactant, examples thereof include compounds in which typically a hydrophilic group and a lipophilic group are provided in the molecule and the hydrophilic portion dissociates in the aqueous solution to become anions or anionic compounds. The anionic surfactant preferably has 3 or more carbon atoms, more preferably has 5 or more carbon atoms and particularly preferably has 10 or more carbon atoms. The upper limit is not particularly limited and the number of carbon atoms is practically 20 or less.

Specific examples of the anionic surfactant include carboxylic acid compounds having 10 or more carbon atoms, phosphonic acid compounds having 10 or more carbon atoms and sulfonic acid compounds having 10 or more carbon atoms. Among these, alkyl sulfonic acid, alkylbenzene sulfonic acid, alkylnaphthalene sulfonic acid, alkyldiphenyl ether sulfonic acid, fatty acid amide sulfonic acid, polyoxyethylene alkyl ether carboxylic acid, polyoxyethylene alkyl ether acetic acid, polyoxyethylene alkyl ether propionic acid, alkylphosphonic acid, fatty acid, and salts thereof are preferable.

Specific examples thereof include EMAL E-27C and NEOPELEX GS (all manufactured by Kao Corporation), and W004, W005 and W017 (all manufactured by Yusho Co., Ltd.). Among these, anionic surfactants formed with sulfonic acid compounds having 10 or more carbon atoms are preferable. Among these, alkyl sulfonic acid, an alkyl sulfonic acid salt, alkylbenzene sulfonic acid, an alkylbenzene sulfonic acid salt, and alkylphosphonic acid are more preferable, and alkylsulfonic acid having 10 to 16 carbon atoms or an alkylsulfonic acid salt is more particularly preferable. Examples of the "salt" include an ammonium salt, a sodium salt, a potassium salt and a tetramethyl ammonium salt.

The content of the anionic surfactant is preferably 20% by mass or less with respect to the total amount of the removing liquid, more preferably 10% by mass or less, and still more preferably 1% by mass or less. The lower limit is preferably 0.001% by mass or more and particularly preferably 0.005% by mass or more.

[Kit]

The removing liquid of the present invention may be formed as a kit composed of plural liquids, or the like. For example, a kit may be in a form where a first agent which contains an alkali compound and a second agent which contains a specific nitrogen-containing compound are combined and the two agents may be mixed to prepare a liquid when being used. At this time, it is preferable that each agent is adjusted such that the pH after mixing is within the above range. However, the pH may be prepared separately after mixing. A preferable range of the content of each agent after mixing or the like is the same as the above-described range of the removing liquid.

[Condensation]

The removing liquid of the present invention may be condensed and stored. When the removing liquid is condensed, the volume of the chemical solution to be stored can be reduced and thus a storage space can be reduced. Thus, this case is preferable. The condensation method is not particularly limited and a method of setting a high concentration in the initial preparing stage can be exemplified. The condensation rate is not particularly limited and may be 2 times to 50 times the use concentration (on a mass basis).

(Container)

The removing liquid of the present invention (irrespective of whether or not the liquid is the kit) can be stored, transported, and used by charging into an arbitrary container as long as it does not cause a problem in corrosion resistance. In addition, for semiconductor applications, it is preferable that the container has high cleanness and less elution of impurities therefrom. Examples of available containers include "CLEAN BOTTLE" series, manufactured by AICELLO CORPORATION, and "PURE BOTTLE" manufactured by KODAMA PLASTICS Co., Ltd. However, the present invention is not limited to these.

[Resist]

Resists that are applied to photomasks for EUV lithography can be widely applied. Among these, a resin composition containing a polymer compound having a phenol structure is preferably used. Particularly, a resist composition including a resin having a hydroxyphenylene structure (preferably a hydroxystyrene structure) is preferable. The weight average molecular weight (Mw) of the polymer compound having a phenol structure is preferably 200 to 100,000 and more preferably 200 to 15,000. The resist composition may be a positive type (in which an image is formed by increasing the solubility in an alkali developing solution by a deprotection reaction) or a negative type (in which an image is formed by decreasing the solubility in an alkali developing solution by a cross-linking reaction or the like). In the peeling of the resist, generally, the technical difficulty level of the negative type is higher than that of the positive type. However, the removing liquid of the present invention exhibits sufficient removal performance even when a negative type resist is removed as well as when a positive type resist is removed.

As the repeating unit having a hydroxyphenylene structure, a unit that can be represented by the following formula (r1) can be exemplified.

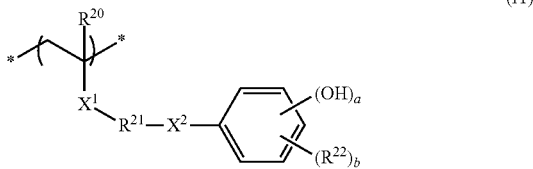

(r1)

$R^{20}$ represents a hydrogen atom or a methyl group.

$R^{21}$ represents a single bond or a bivalent linking group. Examples of the bivalent linking group of $R^{21}$ include an alkylene group. Examples of the alkylene group include a methylene group, an ethylene group, a propylene group, an isopropylene group, an n-butylene group, an isobutylene group, a tert-butylene group, a pentylene group, an isopentylene group, a neopentylene group, and a hexylene group. The above-described bivalent linking group may have a substituent and examples of the substituent include a halogen atom, a hydroxyl group, and an alkoxy group.

$X^1$ and $X^2$ each represents a single bond, an oxy group, a carbonyl group, a carbonyl oxy group, a carbonyl oxy alkylene group (alkylene C1 to C3), or a combination thereof.

a represents an integer of 1 to 5. However, from the viewpoint of the effect of the present invention or easy production, a is preferably 1 or 2 and more preferably 1.

Further, the bonding position of the hydroxyl group in the benzene ring is preferably the 4-position when the position of a carbon atom bonded with $X^2$ is set as a reference (1-position).

$R^{22}$ represents a halogen atom or a linear or branched alkyl group having 1 to 5 carbon atoms. Specific examples thereof include a fluorine atom, a chlorine atom, a bromine atom, a methyl group, an ethyl group, a propyl group, an isopropyl group, an n-butyl group, an isobutyl group, a tert-butyl group, a pentyl group, an isopentyl group, and a neopentyl group.

b represents 0 or an integer of 1 to 4. a+b is 5 or less.

[Resist Removal]

In the present invention, it is preferable that the resist is removed by using a sheet type apparatus. Specifically, a sheet type apparatus which has a treatment tank, transports and rotates the above-described photomask substrate in the treatment tank, applies a removing liquid to the inside of the treatment tank, and brings the substrate into contact with the removing liquid is preferable.

The advantages of the sheet type apparatus are as follows: (i) since a fresh removing liquid is always supplied, the reproducibility is good; and (ii) the in-plane uniformity is high. Further, the use of a kit in which the removing liquid is divided into plural liquids is easy and for example, a method in which the above-described first agent and second agent are mixed in an in-line, and the mixture is discharged is suitably employed. At this time, a method in which the temperature of both the first agent and the second agent is adjusted or the temperature of only one of the first agent and the second agent is adjusted and then mixed in an in-line, and the mixture is discharged is preferable. Among these, the embodiment in which the temperature of both the first agent and the second agent is adjusted is more preferable. When the temperature adjustment of the line is performed, it is preferable that the management temperature is set to be within the same range as the range of treatment temperature which will be described later.

It is preferable that the treatment tank of the sheet type apparatus is provided with a nozzle and a method for discharging a removing liquid to the substrate by swinging the nozzle in the plane direction of the photomask substrate is preferable. When the nozzle is provided, a deterioration of the liquid can be prevented and thus this case is preferable. In addition, when the removing liquid is formed as a kit and divided into two or more liquids, gas that has influence on a human body or an apparatus or the like can be prevented from being produced and thus this case is preferable.

When describing more specific conditions, in the preferable embodiment of the present invention, in the sheet type apparatus, the removing liquid is brought into contact with the substrate by transporting or rotating the photomask substrate in a predetermined direction and applying (discharging, ejecting, flowed down, dropped the like) the removing liquid into the space.

The treatment temperature at which the resist is removed is, when being measured by a temperature measuring method shown in examples to be described later, more preferably 0° C. or higher and particularly preferably 15° C. or higher. The upper limit is preferably 80° C. or lower and more preferably lower than 60° C. When the temperature is set to be within this temperature range, energy consumption for heating and cooling can be suppressed and satisfactory resist removal and effective substrate protection can be realized.

The supply rate of the removing liquid is not particularly limited and is preferably 0.05 L/min to 5 L/min, and more preferably 0.1 L/min to 3 L/min. When the photomask substrate is rotated, it is preferable from the same view point as the above to rotate the photomask substrate at a rate from 50 rpm to 1,000 rpm, even though the rate may depend on the size or the like of the photomask substrate.

In the sheet type treatment according to the preferable embodiment of the present invention, it is preferable that the photomask substrate is brought into contact with the removing liquid by transporting or rotating the photomask substrate in a predetermined direction and ejecting the removing liquid into the space. The supply rate of the removing liquid and the rotation rate of the substrate are as described above.

Figure 5:
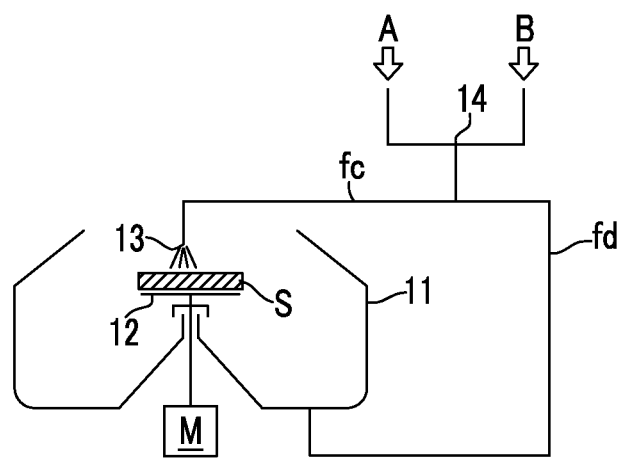
FIG. 5 is an apparatus configuration view showing a part of a resist removing apparatus according to a preferable embodiment of the present invention.

FIG. 5 is an apparatus configuration view showing a part of a resist removing apparatus according to a preferable embodiment of the present invention. In the apparatus of the embodiment, the first agent and the second agent can be mixed by allowing the first agent and the second agent to flow along flow paths respectively and joining both agents at a junction. Then, a removing liquid obtained by allowing the agents to further flow along the flow paths and joining both agents can be brought into contact with the photomask substrate by being discharged or ejected from a discharge port. In this manner, a process from the joining and mixing of the agents at the junction to the contact of the removing liquid with the substrate is preferably performed in an "appropriate time". When describing this process in more detail using the drawing, the prepared removing liquid is ejected from a discharge port 13 and is applied to the upper surface of a photomask substrate S in a treatment container (treatment tank) 11. In the embodiment shown in the drawing, two agents of A and B are supplied and joined at a junction 14. Then, the joined liquid is transported to the discharge port 13 through a flow path fc. A flow path fd represents a returning path for reusing the chemical solution. The substrate S is on a rotating table 12 and is preferably rotated with the rotating table by a rotation driving unit M. The embodiment using such a substrate rotation type apparatus can be similarly applied to a treatment using a removing liquid that is not formed into a kit.

Figure 6:
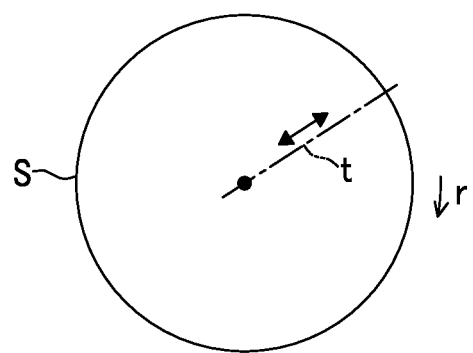
FIG. 6 is a plan view schematically showing a nozzle moving trace on a substrate according to an embodiment of the present invention.

In the configuration of the sheet type apparatus according to the preferable embodiment of the present invention, as shown in FIG. 6, it is preferable that the removing liquid is applied while moving the discharge port (nozzle). Specifically, in the embodiment, when the removing liquid is applied to the photomask substrate S, the substrate is rotated in an r direction. On the other hand, along a movement trace t extending from the center portion of the substrate to the end portion, the discharge port moves. As described above, in the embodiment, the rotation direction of the substrate is set to be different from the movement direction of the discharge port and thus both are set to move relatively to each other. As a result, the removing liquid can be uniformly applied to the entire surface of the substrate. Thus, uniform resist removal can be suitably ensured.

The movement rate of the discharge port (nozzle) is not particularly limited and is preferably 0.1 cm/s or more and more preferably 1 cm/s or more. On the other hand, the upper limit is preferably 30 cm/s or less and more preferably 15 cm/s or less. The movement trace may be a straight line or a curved line (for example, a circular arc line). In any case, the movement rate can be reliably calculated from the distance of an actual trace and the time spent for the movement.

[Photomask Production]

In the embodiment, a photomask for EUV lithography can be produced through a process of removing a resist by the above-described method. At this time, the above-described specific removing liquid is used for removing the resist. The procedure of the processes described in the specification is not interpreted with limitations and the procedure may be appropriately changed. In addition, another process may be provided between each process.

According to the resist removing liquid and the removal method according to the preferable embodiments of the present invention, it is possible to prepare a photomask for EUV lithography which realizes high size accuracy and satisfactory EUV light reflectivity and absorbency.

EXAMPLE

Hereinafter, the present invention will be described in more detail based on the following examples, but the invention is not intended to be limited to the following examples.

A photomask substrate in which a negative type resist ("FEN-271", containing a phenol-based resin, manufactured by Fujifilm Electronic Materials Co., Ltd.) is formed after exposure and development was prepared. The thickness of the resist layer r was 50 nm. The photomask substrate has a structure shown in FIG. 1 and as a glass substrate, $SiO_2$—$TiO_2$-based glass substrate (thickness: 6 mm) was used. As a reflecting layer, a layer formed by laminating 40 Si layers and Mo layers (thickness: 270 nm) was used. The material for a protective layer is Ru (thickness: 10 nm) and the material for an absorbing layer is TaN (thickness: 70 nm). For the glass substrate, a circular substrate having a size of 2 cm×2 cm was used. The etching of the TaN layer was performed by plasma RF etching and patterning was performed along the resist as shown in the drawing.

<Resist Removal Performance>

The above-described test substrate was immersed in each chemical solution prescribed in Table 1 (pH 9 or higher) at 25° C. for 1 minute. Then, the remaining resist on the substrate was observed using a SEM. Specifically, 100 ml of a chemical solution was poured into a 200 ml beaker and the above-described immersion was performed while stirring the solution at 500 rpm (stirring bar size: 7 φ×20 (mm)). After the immersion, a rinse treatment was performed with running water at 2 L/min and the substrate was dried by nitrogen blow.

<Damage Evaluation of Protective Film>

The above-described test substrate was immersed in each chemical solution prescribed in Table 1 at 25° C. for 5 minute and further immersed in the following SC-1 process liquid at 25° C. for 10 minutes. The stirring conditions and the rinse treatment were the same as in the above-described resist removing test.

The thickness of the absorbing layer (TaN) and the protective layer (Ru) after the treatment was measured and a reduction in thickness was calculated. At this time, the thickness was calculated by measuring the thickness before and after the resist removing treatment using an Ellipsometer (VASE spectroscopic ellipsometer, manufactured by J. A. Woollam Japan Co., Inc.). An average value at 5 points was adopted (measurement conditions were as follows: measurement range: 1.2 eV to 2.5 eV and measurement angle: 70 degrees and 75 degrees.).

[SC-1 Treatment Liquid]

28% ammonia water: 30% hydrogen peroxide:water=1:1:98 (volume ratio)

TABLE 1

| Test No. | Alkali compound | Concentration (% by mass) | Nitrogen-containing compound | Concentration (% by mass) | Water | Removal performance | TaN (nm) | Ru (nm) |
|---|---|---|---|---|---|---|---|---|
| 101 | TMAH | 6.0 | Polyhexadimethrine, Mw 6,000 | 0.1 | Remainder | A | 0.3 | 0.1 |
| 102 | NH$_4$OH | 9.0 | Poly(4-vinylpyridine), Mw 2,000 | 0.2 | Remainder | A | 0.3 | 0.2 |
| 103 | TEAH | 10.0 | Polyvinylimidazole, Mw 6,000 | 0.5 | Remainder | A | 0.3 | 0.1 |
| 104 | TMAH | 11.0 | Dimethylamine epihydrin-based polymer, Mw 5,000 | 0.2 | Remainder | A | 0.4 | 0.1 |
| 105 | NH$_4$OH | 9.0 | Polyvinylamine, Mw 5,000 | 0.5 | Remainder | A | 0.2 | 0.2 |

TABLE 1-continued

| Test No. | Alkali compound | Concentration (% by mass) | Nitrogen-containing compound | Concentration (% by mass) | Water | Removal performance | TaN (nm) | Ru (nm) |
|---|---|---|---|---|---|---|---|---|
| 106 | TMAH | 4.0 | Polyethyleneimine, Mw 300 | 0.8 | Remainder | A | 0.1 | 0.2 |
| 107 | KOH | 6.0 | Polyvinylamine, Mw 5,000 | 0.1 | Remainder | A | 0.5 | 0.3 |
| 108 | TMAH | 5.0 | Polyhistidine, Mw 5,000 | 0.4 | Remainder | A | 0.5 | 0.2 |
| 109 | TMAH | 9.0 | Polyallylamine, Mw 3,000 | 0.2 | Remainder | A | 0.2 | 0.2 |
| 110 | TEAH | 11.0 | Polyarginine, Mw 7,000 | 1 | Remainder | A | 0.6 | 0.1 |
| 111 | TBAH | 15.0 | Polymethyldiallylammonium, Mw 1,000 | 0.5 | Remainder | A | 0.2 | 0.2 |
| 112 | TBAH | 9.0 | Polyallylamine, Mw 2,000 | 0.05 | Remainder | A | 0.6 | 0.2 |
| 113 | TPAH | 8.0 | Polyethyleneimine, Mw 10,000 | 0.1 | Remainder | A | 0.2 | 0.1 |
| 114 | TMAH | 1.0 | Polyethyleneimine, Mw 600 | 2 | Remainder | B | 0.1 | 0.2 |
| 115 | TEAH | 6.0 | Polyethyleneimine, Mw 3,000 | 2 | Remainder | A | 0.1 | 0.1 |
| 116 | TMAH | 9.0 | Polyallylamine, Mw 2,000 | 1 | Remainder | A | 0.1 | 0.2 |
| 117 | TMAH | 7.0 | Polylysine, Mw 4,000 | 0.6 | Remainder | A | 0.5 | 0.2 |
| 118 | TEAH | 14.0 | Polyethyleneimine, Mw 25,000 | 0.5 | Remainder | A | 0.5 | 0.1 |
| 119 | TBAH | 16.0 | Polyornithine, Mw 2,000 | 0.4 | Remainder | A | 0.5 | 0.1 |
| 120 | TBAH | 14.0 | Diethylenetriamine | 0.9 | Remainder | A | 0.3 | 0.2 |
| 121 | TPAH | 13.0 | Triethylenetetramine | 0.8 | Remainder | A | 0.3 | 0.2 |
| 122 | TMAH | 20.0 | Tetraethylenepentamine | 1 | Remainder | A | 0.3 | 0.1 |
| 123 | NH$_4$OH | 10.0 | Polyethyleneimine, Mw 10,000 | 5 | Remainder | B | 0.1 | 0.2 |
| 124 | TMAH | 11.0 | Polyvinylamine, Mw 15,000 | 0.1 | Remainder | A | 0.2 | 0.2 |
| 125 | TMAH | 13.0 | Pentaethylenehexamine | 0.4 | Remainder | A | 0.3 | 0.1 |
| 126 | TMAH | 10.0 | Polydiallylamine | 0.5 | Remainder | A | 0.4 | 0.1 |
| 127 | TMAH | 9.0 | Polymethyldiallylamine | 0.5 | Remainder | A | 0.3 | 0.2 |
| C01 | TMAH | 10.0 | — | — | Remainder | A | 1.0 | 0.5 |
| C02 | — | — | Polyallylamine, Mw 3,000 | 0.01 | Remainder | C | 0.1 | 0.2 |

Removal performance: resist removal performance A: Peelable B: Partially peelable or reductions in thickness confirmed C: No change
TaN (nm): Film reduction amount (thickness) of TaN
Ru (nm): Film reduction amount (thickness) of Ru From the above results, according to the present invention, it is found that a resist applied to a photomask for EUV lithography can be suitably removed and a high quality photomask can be produced with high productivity without damaging the protective layer and the absorbing layer.

The removing treatment test was performed in the same manner as described above except that the resist was changed to a positive type resist "FEP-171" manufactured by Fujifilm Electronic Materials Co., Ltd. As a result, according to the present invention, it was confirmed that satisfactory resist removal performance and corrosion suppression performance of the protective layer could also be obtained in the positive type resist.

In addition, according to the present invention, it was found that when layers formed using Cr, Al and Ta, other than Ru, were used as the protective layer, satisfactory protection performance (corrosion suppression performance) was also exhibited. Further, it was found that as for an absorbing layer, when layers formed using TaBO, TaBN and TaNO, other than the above TaN, were used to perform the test, satisfactory protection performance (corrosion suppression performance) was exhibited against these materials.

EXPLANATION OF REFERENCES

1: absorbing layer
1a: patterned absorbing layer
2: protective layer
3: reflecting layer
4: glass substrate (base substrate)
5: conductive layer
10: photomask substrate
11: treatment container (treatment tank)
12: rotating table
13: discharge port
14: junction
31: silicon layer
32: molybdenum layer
100: photomask
l: removing liquid
m: rotation driving unit
r: resist layer
s: photomask substrate
t: movement trace

What is claimed is:
1. A resist removal method comprising:
removing a resist provided on a photomask substrate by bringing a resist removing liquid into contact with the resist when a photomask for EUV lithography is produced,
wherein the resist removing liquid contains an alkali compound, a specific nitrogen-containing compound, and water,
the content of the water is more than 50% by mass, and
the specific nitrogen-containing compound is a compound represented by any of the following formulae (a-1) to (a-10):

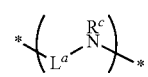

a-1

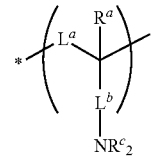

a-2

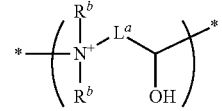

a-3

-continued

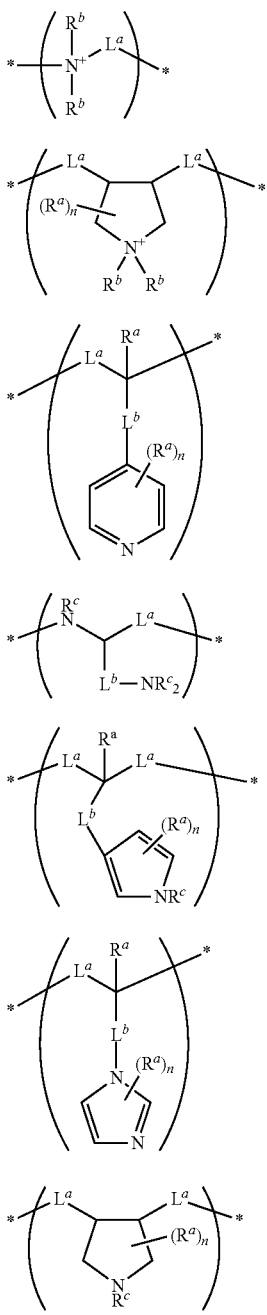

wherein $R^a$ represents a hydrogen atom, an alkyl group, an alkenyl group, an aryl group or a heterocyclic group; $R^b$ represents an alkyl group or an alkenyl group; $L^a$ represents an alkylene group, a carbonyl group, an imino group, an arylene group, a heterocyclic group, or a combination thereof; $L^b$ represents a single bond, an alkylene group, a carbonyl group, an imino group, an arylene group, a heterocyclic group, or a combination thereof; $R^c$ represents a hydrogen atom or an alkyl group; and n represents an integer of 0 or more.

2. The resist removal method according to claim 1, wherein the alkali compound is a quaternary ammonium hydroxide.

3. The resist removal method according to claim 1, wherein the molecular weight of the specific nitrogen-containing compound is 300 or more and 20,000 or less.

4. The resist removal method according to claim 1, wherein the specific nitrogen-containing compound is a compound represented by the following formula (b), $$R^c_2N-[L^d-N(R^c)]_m-L^d-NR^c_2 \quad (b)$$

in the formula, $R^c$ represents a hydrogen atom or an alkyl group; m represents an integer of 0 or more; and $L^d$ represents an alkylene group, a carbonyl group, an imino group, an arylene group, a heterocyclic group, or a combination thereof.

5. The resist removal method according to claim 1, wherein removing the resist is performed at a treatment temperature of 15° C. or higher to less than 60° C.

6. The resist removal method according to claim 1, wherein when the resist removing liquid is brought into contact with the resist on the photomask substrate to remove the resist, the resist removing liquid is brought into contact with the resist by being discharged, ejected, flowed down or dropped.

7. The resist removal method according to claim 1, wherein the resist is a resin composition containing a polymer compound having a phenol structure.

8. A method for producing a photomask for EUV lithography comprising:
forming a photomask substrate by providing a reflecting layer, a protective layer, and an absorbing layer in this order on a base substrate;
providing a resist on an upper side of the absorbing layer of the photomask substrate;
patterning the resist by exposing and developing the photomask substrate with the resist to form a resist pattern;
etching a portion of the absorbing layer on which the resist is removed; and
removing the resist remaining after the etching by the resist removal method according to claim 1.

9. A resist removing liquid that is used in patterning of a photomask for EUV lithography, the liquid comprising:
an alkali compound;
a specific nitrogen-containing compound; and
water,
wherein the content of the water is more than 50% by mass, and
the specific nitrogen-containing compound is a compound represented by any of the following formulae (a-1) to (a-10):

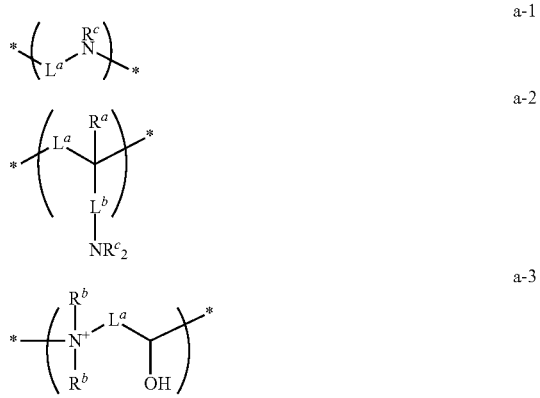

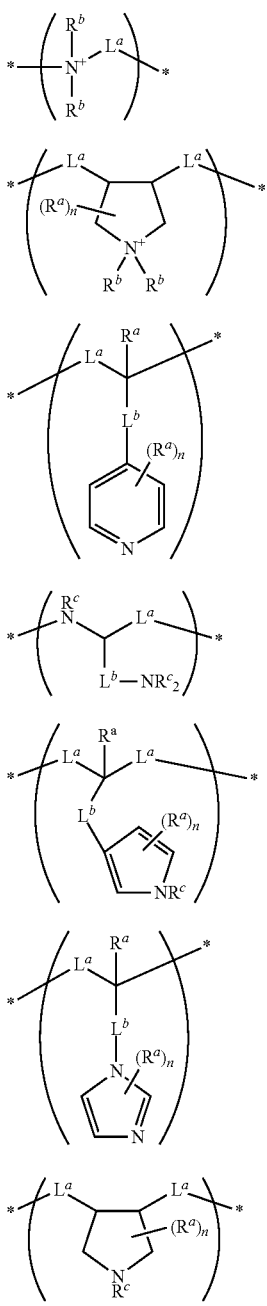

wherein $R^a$ represents a hydrogen atom, an alkyl group, an alkenyl group, an aryl group or a heterocyclic group; $R^b$ represents an alkyl group or an alkenyl group; $L^a$ represents an alkylene group, a carbonyl group, an imino group, an arylene group, a heterocyclic group, or a combination thereof; $L^b$ represents a single bond, an alkylene group, a carbonyl group, an imino group, an arylene group, a heterocyclic group, or a combination thereof; $R^c$ represents a hydrogen atom or an alkyl group; and n represents an integer of 0 or more.

10. The resist removing liquid according to claim 9, wherein the specific nitrogen-containing compound has a primary amine structure, a secondary amine structure, a tertiary amine structure, or a quaternary ammonium structure.

11. The resist removing liquid according to claim 9, wherein the alkali compound is a quaternary ammonium hydroxide.

12. The resist removing liquid according to claim 9, wherein the molecular weight of the specific nitrogen-containing compound is 300 or more and 20,000 or less.

13. The resist removing liquid according to claim 9, wherein the specific nitrogen-containing compound is a compound represented by the following formula (b), $$R^c_2N-[L^d-N(R^c)]_m-L^d-NR^c_2 \quad (b)$$

in the formula, $R^c$ represents a hydrogen atom or an alkyl group; m represents an integer of 0 or more; and $L^d$ represents an alkylene group, a carbonyl group, an imino group, an arylene group, a heterocyclic group, or a combination thereof.

14. The resist removing liquid according to claim 9, comprising 0.5% by mass to 40% by mass of the alkali compound.

15. The resist removing liquid according to claim 9, comprising 0.01% by mass to 20% by mass of the specific nitrogen-containing compound.

16. A resist removal method comprising:
removing a resist on an absorbing layer of a photomask substrate by bringing a resist removing liquid into contact with the resist when a photomask for EUV lithography is produced,
wherein the photomask substrate includes a reflecting layer, a protecting layer, and the absorbing layer in this order,
the resist removing liquid contains an alkali compound, a specific nitrogen-containing compound, and water, and
the content of the water is more than 50% by mass.

17. The resist removal method according to claim 16, wherein the specific nitrogen-containing compound has a primary amine structure, a secondary amine structure, a tertiary amine structure, or a quaternary ammonium structure.

18. The resist removal method according to claim 16, wherein the alkali compound is a quaternary ammonium hydroxide.

19. The resist removal method according to claim 16, wherein the molecular weight of the specific nitrogen-containing compound is 300 or more and 20,000 or less.

20. The resist removal method according to claim 16, wherein the specific nitrogen-containing compound is a compound represented by any of the following formulae (a-1) to (a-10):

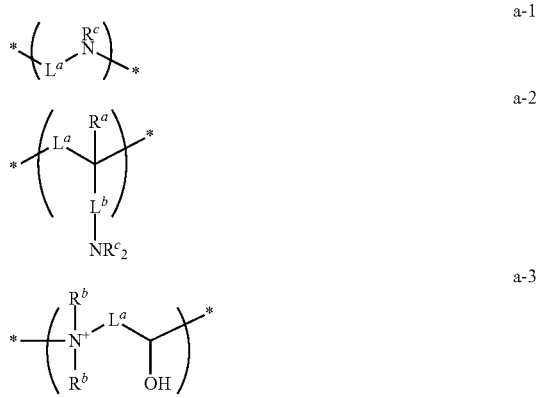

-continued

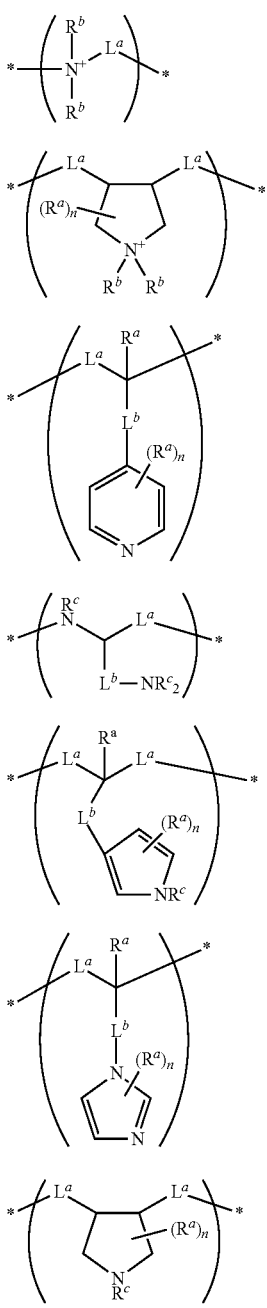

wherein $R^a$ represents a hydrogen atom, an alkyl group, an alkenyl group, an aryl group or a heterocyclic group; $R^b$ represents an alkyl group or an alkenyl group; $L^a$ represents an alkylene group, a carbonyl group, an imino group, an arylene group, a heterocyclic group, or a combination thereof; $L^b$ represents a single bond, an alkylene group, a carbonyl group, an imino group, an arylene group, a heterocyclic group, or a combination thereof; $R^c$ represents a hydrogen atom or an alkyl group; and n represents an integer of 0 or more.

21. The resist removal method according to claim 16, wherein the specific nitrogen-containing compound is a compound represented by the following formula (b),

in the formula, $R^c$ represents a hydrogen atom or an alkyl group; m represents an integer of 0 or more; and $L^d$ represents an alkylene group, a carbonyl group, an imino group, an arylene group, a heterocyclic group, or a combination thereof.

22. A resist removal method comprising:

removing a resist provided on a layer including at least one of Ta, Ru, Ru compound, CrN, or $SiO_2$ by bringing a resist removing liquid into contact with the resist when a photomask for EUV lithography is produced, wherein the resist removing liquid contains an alkali compound, a specific nitrogen-containing compound, and water, and the content of the water is more than 50% by mass.

23. The resist removal method according to claim 22, wherein the specific nitrogen-containing compound has a primary amine structure, a secondary amine structure, a tertiary amine structure, or a quaternary ammonium structure.

24. The resist removal method according to claim 22, wherein the alkali compound is a quaternary ammonium hydroxide.

25. The resist removal method according to claim 22, wherein the molecular weight of the specific nitrogen-containing compound is 300 or more and 20,000 or less.

26. The resist removal method according to claim 22, wherein the specific nitrogen-containing compound is a compound represented by any of the following formulae (a-1) to (a-10):

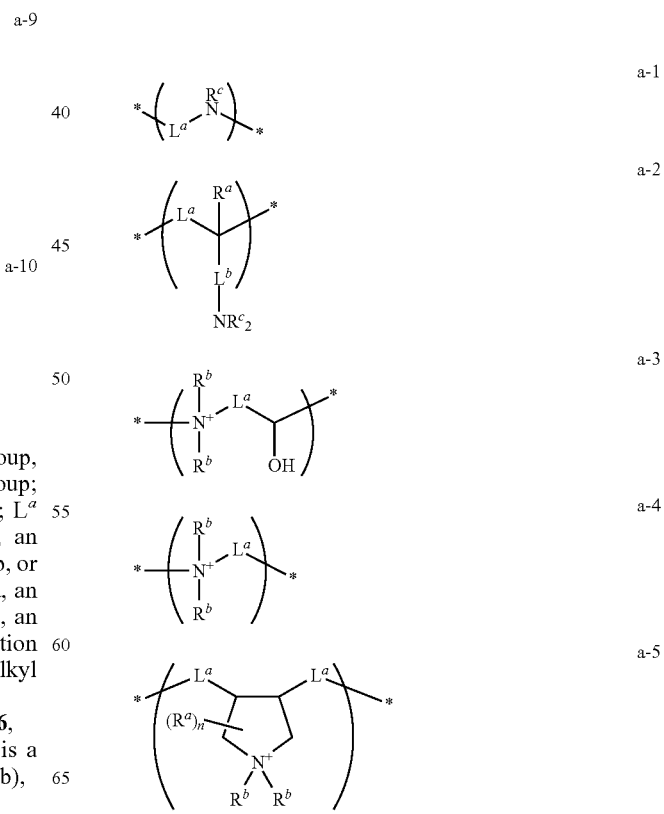

-continued

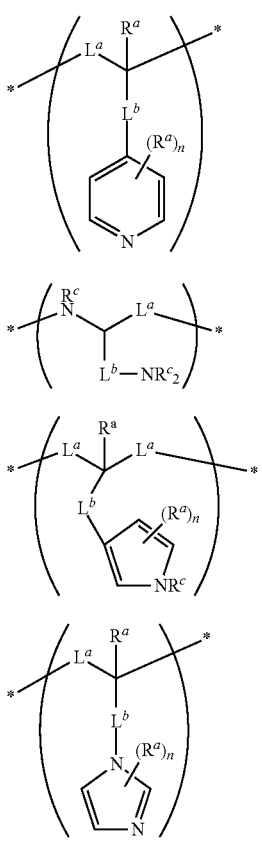

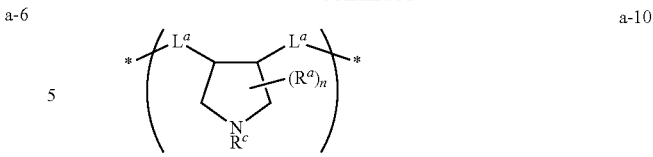

wherein $R^a$ represents a hydrogen atom, an alkyl group, an alkenyl group, an aryl group or a heterocyclic group; $R^b$ represents an alkyl group or an alkenyl group; $L^a$ represents an alkylene group, a carbonyl group, an imino group, an arylene group, a heterocyclic group, or a combination thereof; $L^b$ represents a single bond, an alkylene group, a carbonyl group, an imino group, an arylene group, a heterocyclic group, or a combination thereof; $R^c$ represents a hydrogen atom or an alkyl group; and n represents an integer of 0 or more.

27. The resist removal method according to claim 22, wherein the specific nitrogen-containing compound is a compound represented by the following formula (b), $$R^c{}_2N-[L^d-N(R^c)]_m-L^d-NR^c{}_2 \qquad (b)$$

in the formula, $R^c$ represents a hydrogen atom or an alkyl group; m represents an integer of 0 or more; and $L^d$ represents an alkylene group, a carbonyl group, an imino group, an arylene group, a heterocyclic group, or a combination thereof.

* * * * *